United States Patent [19]
Coleman

[11] Patent Number: 5,889,391
[45] Date of Patent: Mar. 30, 1999

[54] POWER SUPPLY HAVING COMBINED REGULATOR AND PULSING CIRCUITS

[75] Inventor: Charles Coleman, Fort Collins, Colo.

[73] Assignee: Sierra Applied Sciences, Inc., Boulder, Colo.

[21] Appl. No.: 966,448

[22] Filed: Nov. 7, 1997

[51] Int. Cl.$^6$ ........................................... G05F 1/59
[52] U.S. Cl. .......................................... 323/271; 323/285
[58] Field of Search ................................. 323/220, 223, 323/225, 265, 268, 271, 272, 282, 285, 349, 350, 351

[56] References Cited

U.S. PATENT DOCUMENTS

| | | | |
|---|---|---|---|
| 3,101,440 | 8/1963 | Early ......................................... | 323/220 |
| 3,305,767 | 2/1967 | Beihl et al. ............................. | 323/282 |
| 3,670,233 | 6/1972 | Zellmer et al. ......................... | 323/282 |
| 4,103,324 | 7/1978 | Vandervelen et al. ................... | 363/89 |
| 4,227,988 | 10/1980 | Galwey et al. .......................... | 323/285 |
| 4,242,629 | 12/1980 | Shuey ..................................... | 323/282 |
| 4,694,240 | 9/1987 | Grunsch .................................. | 323/285 |
| 4,931,169 | 6/1990 | Scherer et al. ..................... | 204/298.11 |
| 4,936,960 | 6/1990 | Siefkes et al. ..................... | 204/192.38 |
| 4,963,238 | 10/1990 | Siefkes et al. ..................... | 204/192.12 |
| 4,981,566 | 1/1991 | Wurczinger ........................ | 204/192.13 |
| 5,006,213 | 4/1991 | Sichmann et al. ................. | 204/192.14 |
| 5,009,764 | 4/1991 | Siefkes et al. ..................... | 204/298.08 |
| 5,070,294 | 12/1991 | Nochi ...................................... | 323/282 |
| 5,074,984 | 12/1991 | Sichmann et al. ................. | 204/192.14 |
| 5,089,764 | 2/1992 | Bobier et al. ............................. | 323/282 |
| 5,108,571 | 4/1992 | Ludwig et al. ..................... | 204/192.13 |
| 5,126,033 | 6/1992 | Szczyrbowski et al. .......... | 204/298.08 |
| 5,164,656 | 11/1992 | Gulezynski .............................. | 323/271 |
| 5,192,894 | 3/1993 | Teschner ............................ | 215/111.21 |
| 5,402,060 | 3/1995 | Erisman .................................. | 323/268 |
| 5,427,669 | 6/1995 | Drummond ........................ | 204/192.12 |

FOREIGN PATENT DOCUMENTS

| | | | |
|---|---|---|---|
| 221202 | 4/1985 | Germany ...................... | C23C 14/38 |
| 229160A1 | 10/1985 | Germany ...................... | C23C 14/38 |
| 3919147A1 | 12/1990 | Germany ...................... | C23C 14/35 |
| 3121389A1 | 8/1992 | Germany ...................... | C23C 15/00 |
| 4113704A1 | 10/1992 | Germany ...................... | H05H 1/46 |
| 0553410A1 | 8/1993 | Germany ...................... | C23C 14/35 |
| 57-69324 (A) | 4/1982 | Japan ............................. | C23C 15/00 |
| 61-30665 (A) | 2/1986 | Japan ............................. | C23C 14/34 |
| 63-190168 (A) | 8/1988 | Japan ............................. | C23C 14/34 |
| 3-56671 (A) | 3/1991 | Japan ............................. | C23C 14/40 |
| 3-61368 (A) | 3/1991 | Japan ............................. | C23C 14/54 |
| 2045553 A | 3/1980 | United Kingdom ............. | H02J 1/00 |

OTHER PUBLICATIONS

Beisswenger, T. et al., "Economical Considerations on Modern Web Sputtering Technology", Society of Vacuum Coaters, 35th Annual Technical Coinferece Proceedings, pp. 128–134 (1992).

Anderson, L., "A New Technique for Arc Control in DC Sputtering", Society of Vacuum Coaters, 35th Annual technical Conference Proceedings, pp. 325–329 (1992).

Schat, Doug, "The MDX as a Strategic Tool in reducing Arcing", Application Notes, Advanced Energy Industries, Inc. (1985).

*Primary Examiner*—Jeffrey Sterrett
*Attorney, Agent, or Firm*—Klaas, Law, O'Meara & Malkin, P.C.; Bruce E. Dahl, Esq.

[57] ABSTRACT

A combined regulator and pulsing circuit may comprise a first diode having a cathode that is electrically connected to a positive terminal of a supply of direct current and to a first output terminal of the combined regulator and pulsing circuit. A first switching device is electrically connected between the anode of the first diode and a negative terminal of the supply of direct current. An inductor is electrically connected between the anode of the diode and a second output terminal of the combined regulator and pulsing circuit. The first plate of a capacitor is electrically connected to the first output terminal, and a second switching device is electrically connected between the second plate of the capacitor and the second output terminal. A control system is operatively associated with the first and second switching devices and operates the first and second switching devices between the conducting and non-conducting states.

22 Claims, 5 Drawing Sheets

POWER SUPPLY HAVING COMBINED REGULATOR AND PULSING CIRCUITS

FIELD OF THE INVENTION

The present invention relates to power supplies for plasma processing systems in general and more specifically to power supplies for sputter deposition systems.

BACKGROUND

Plasma deposition refers to any of a wide variety of processes in which a plasma is used to assist in the deposition of thin films or coatings onto the surfaces of objects. For example, plasma deposition processes are widely used in the electronics industry to fabricate integrated circuits and other electronic devices, as well as to fabricate the magnetic tapes and disks used in audio, video, and computer applications. Plasma deposition processes may also be used to apply coatings to various objects to improve or change the properties of the objects. For example, plasma deposition processes may be used to apply wear resistant coatings to machine tools, while other types of coatings may be used to increase the corrosion resistance of other items, such as bearings, turbine blades, etc, thereby enhancing their performance. In still other applications, plasma deposition may be used to apply coatings to various types of surfaces in the optics and glass industries.

In most plasma deposition processes the plasma is created by subjecting a low-pressure process gas (e.g., argon) contained within a vacuum chamber to an electric field. The electric field, which is typically created between two electrodes, ionizes the process gas and creates the plasma. In the case of a DC sputter deposition plasma process, the material (commonly referred to as the target) to be deposited on the object or substrate is connected as the negative electrode (i.e., cathode), whereas some other element, commonly the vacuum chamber itself, is connected as the positive electrode or anode. Ionized process gas atoms comprising the plasma are accelerated toward and ultimately impact the negatively charged cathode/target, dislodging or sputtering atoms from the target material. The sputtered atoms subsequently condense on various items in the chamber, including the substrate that is to be coated. The substrate is usually positioned with respect to the target so that a majority of the sputtered target atoms condense on the surface of the substrate.

Sputter deposition processes of the type described above are usually referred to as "non-reactive" processes in that the sputtered atoms deposited on the surface of the substrate do not react with other materials. However, sputter deposition processes have also been developed wherein the target material is sputtered in the presence of a reactive material (e.g., oxygen or nitrogen gas). Such "reactive" sputtering processes may be used to deposit a film comprising the sputtered target material and the reactive species. A wide variety of compounds, such as $SiO_2$, $Al_2O_3$, $Si_3N_4$, and TiO, can be deposited by reactive sputter deposition processes.

While reactive sputtering processes are known and have been used for years, they continue to be plagued by the periodic occurrence of electrical discharges or arcs within the vacuum chamber. Such electrical discharges or arcs can take on different forms depending on the characteristics of the sputtering apparatus and on the particular plasma process being used. For example, arcs may occur between the target material, which is typically connected as the cathode in a DC sputtering process, and the substrate itself, certainly causing a defect in the coating, if not ruining the substrate entirely. Alternatively, the arc may occur between the target and some other part of the vacuum chamber, in which case the deleterious effects of the arc are usually less severe, but nevertheless tend to degrade the overall quality of the coating. The arcs can be short lived, lasting only a few milliseconds or so, or may be continuous, again depending on the particular apparatus and process being used. While such arcing can occur in nearly every kind of plasma process, the tendency of such arcs to occur is much greater in reactive processes where the compound film being deposited is an electrical insulator, such as $Al_2O_3$.

Several methods for preventing, or at least reducing the frequency of such arc discharges, rely on the selective control of the power supply used to place the charge on the electrodes. For example, one such method has been to simply turn-off the power supply as soon as an arc is detected, then turn it back on again once the arc has dissipated. While this method can effectively quench sustained arcs, the stored energy in most power supplies takes time to dissipate, increasing the response time, i.e., the time it takes to remove the electrical potential from the electrodes, to the point where such devices cannot effectively quench short duration arc events. Consequently, all that is really accomplished is a reduction in overall deposition rate, with little or no reduction in the adverse effects produced by the arc event itself.

Another control method has been to momentarily interrupt (i.e., disconnect) the power supply from the electrodes during the arc event. While the response time of this method is usually considerably faster, i.e., the voltage can be removed from the electrodes within a few milliseconds or so, it is difficult to dissipate the stored energy in the power supply. Consequently, such methods tend to stress the power supply or switching devices used to disconnect the power supply to the point of burn-out.

Another method of interrupting the voltage placed on the electrodes has been to use a tapped inductor connected in series between one terminal of the power supply and one of the electrodes. When an arc is detected, the center tap of the inductor is momentarily connected to the other terminal of the power supply. This has the effect of momentarily reversing the voltage on the electrodes. In certain cases, the magnitude of the reversed voltage charge is usually sufficient to quench the arc. Unfortunately, however, this method is not effective in suppressing arcs having impedances lower than the impedance of the switching network and center tap, which is a common occurrence. Consequently, the use of such center-tapped inductors has not proven to be a panacea.

While other devices exist and are being used with some degree of success, none are without their disadvantages. For example, many such other devices can only effectively suppress certain types of arc events or only arcs created under certain conditions. Other devices may have more effective arc suppression characteristics, but are usually plagued with complex electronic circuits and devices, which may be expensive to produce and/or prone to failure.

Consequently, a need exists for a method and apparatus for preventing and/or suppressing arc events in plasma processes and under various operating conditions. Such a method and apparatus should allow for the effective suppression of arcs under a wide range of conditions, but without the need to resort to expensive or complex circuit elements. Additional advantages could be realized if such a device could be used in conjunction with conventional power supplies.

SUMMARY OF THE INVENTION

A combined regulator and pulsing circuit according to the present invention may comprise a first diode having a cathode that is electrically connected to a positive terminal of a supply of direct current and to a first output terminal of the combined regulator and pulsing circuit. A first switching device is electrically connected between the anode of the first diode and a negative terminal of the supply of direct current. An inductor is electrically connected between the anode of the diode and a second output terminal of the combined regulator and pulsing circuit. The first plate of a capacitor is electrically connected to the first output terminal, and a second switching device is electrically connected between the second plate of the capacitor and the second output terminal. A control system is operatively associated with the first and second switching devices and operates the first and second switching devices between the conducting and non-conducting states.

Also disclosed is a method for regulating a current flowing between a first electrode and a second electrode and for reversing a voltage polarity between the first and second electrodes that comprises the steps of: Connecting the first electrode to a positive terminal of a supply of direct current; connecting the second electrode to the combined regulator and pulsing circuit; switching the first switching device between a conducting state and a non-conducting state to regulate the current flowing between the first and second electrodes; and switching the second switching device between a non-conducting state and a conducting state to reverse the voltage potential on the first and second electrodes.

BRIEF DESCRIPTION OF THE DRAWINGS

Illustrative and presently preferred embodiments of the invention are shown in the accompanying drawings in which.

DETAILED DESCRIPTION OF THE INVENTION

Figure 1:
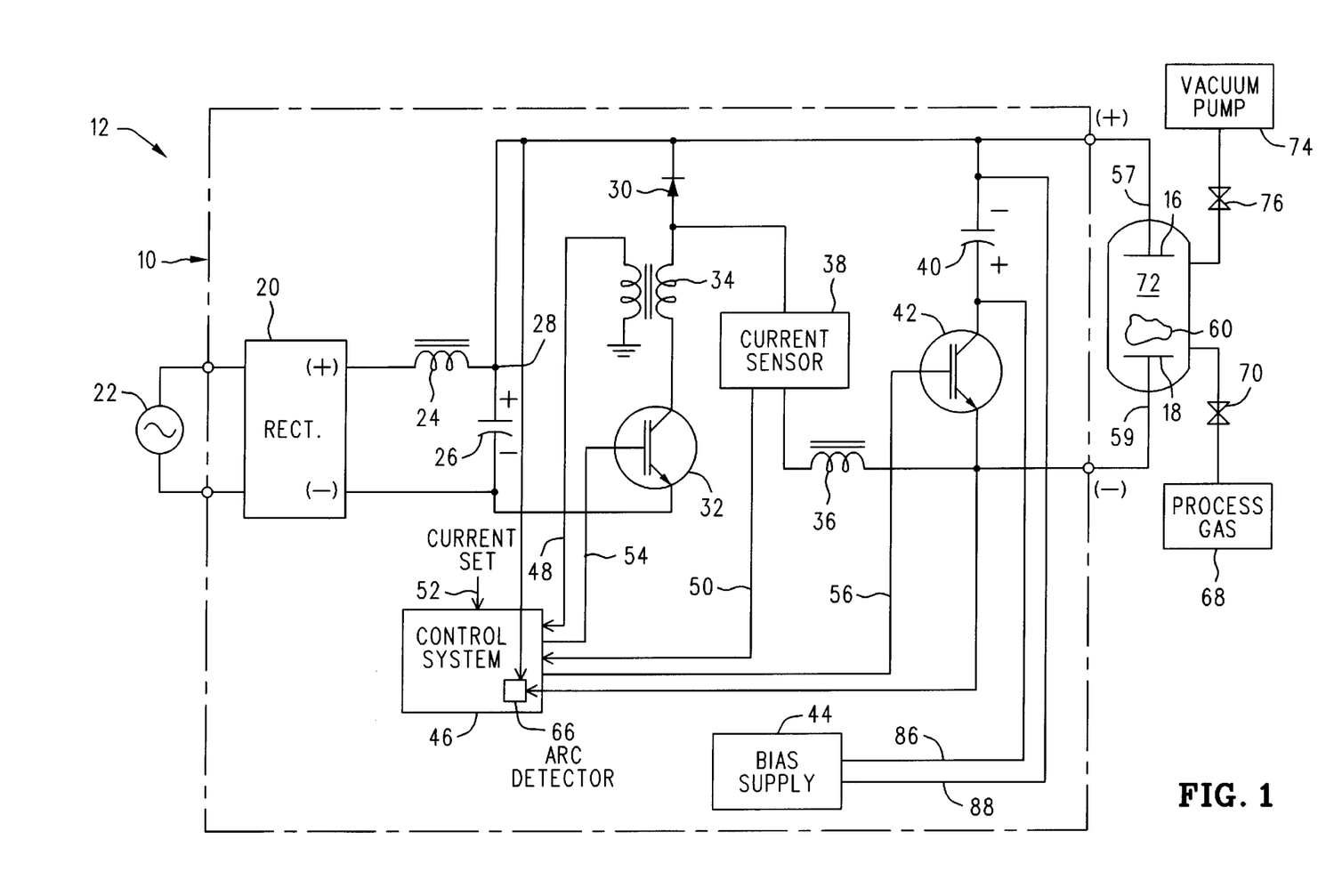
FIG. 1 is a schematic representation of a first embodiment of a combined regulator and pulsing circuit according to the present invention.

A power supply having a combined regulator and pulsing circuit 10 according to one preferred embodiment of the present invention is shown in FIG. 1 as it could be utilized in a plasma processing system 12 of the type that may be used to perform any of a wide variety of plasma processes. For example, in the embodiments shown and described herein, the plasma processing system 12 is used to perform sputter deposition to deposit a thin film or coating (not shown) on the surface of a substrate (also not shown) contained within a process chamber 14. The power supply having a combined regulator and pulsing circuit 10 provides power to the plasma processing system 12 in the form of a DC output signal 64 (FIG. 2c) that is placed across a first electrode 16 and a second electrode 18 contained within the process chamber 18. In one preferred embodiment, the first electrode 16 is connected to the positive (+) output terminal of the combined regulator/pulsing circuit 10, thus serves as the anode. The second electrode 18 is connected to the negative (−) output terminal, thus serves as the cathode.

The power supply having a combined regulator and pulsing circuit 10 includes a rectifier circuit 20 which may be connected to a suitable external power source, such as an alternating current source 22. The rectifier circuit 20 converts alternating current produced by the alternating current source 22 into a direct current suitable for use by the combined regulator and pulsing circuit 10. A first inductor 24 and a first capacitor 26 are connected in series across the positive (+) and negative (−) output terminals of the rectifier circuit 20. The positive (+) output terminal of the combined regulator/pulsing circuit 10 is connected to the node 28 between the first inductor 24 and the first capacitor 26. The positive (+) output terminal of the combined regulator/pulsing circuit 10 may then be electrically connected to the first electrode 16 by any convenient conductor, such as a wire 57. A diode 30 and a first switching device 32 are connected in series across the first capacitor 26. A current sensing device, such as a transformer 34, may be connected in series between the diode 30 and first switching device 32, as will be described in greater detail below.

A second inductor 36 is connected in series between the anode of diode 30 and the negative (−) output terminal of the combined regulator/pulsing circuit 10. The negative (−) output terminal of the combined regulator/pulsing circuit 10 may then be connected to the second electrode 18 by any convenient conductor, such as wire 59. An optional current sensor 38 may be connected in series between the anode of diode 30 and the second inductor 36. A second capacitor 40 and a second switching device 42 are connected in series across the positive (+) and negative (−) output terminals of the combined regulator and pulsing circuit 10.

A bias supply circuit 44 may be connected across the second capacitor 40 to maintain the charge on the second capacitor 40 within a predetermined range. A control system 46 connected to the first and second switching devices 32 and 42, respectively, switches each switching device 32, 42 between a conducting and a non-conducting state in response to current feedback signals 48 and 50 produced by the respective current sensing devices 34 and 38 and in response to a current set signal 52.

As will be explained in greater detail below, the first switching device 32 performs the regulation function (i.e., regulates the current output of the combined regulator and pulsing circuit 10), whereas the second switching device 42 provides the pulsing function (i.e., provides the polarity reversing pulses 58 (FIG. 2c) comprising the DC output signal 64).

Figure 2A:
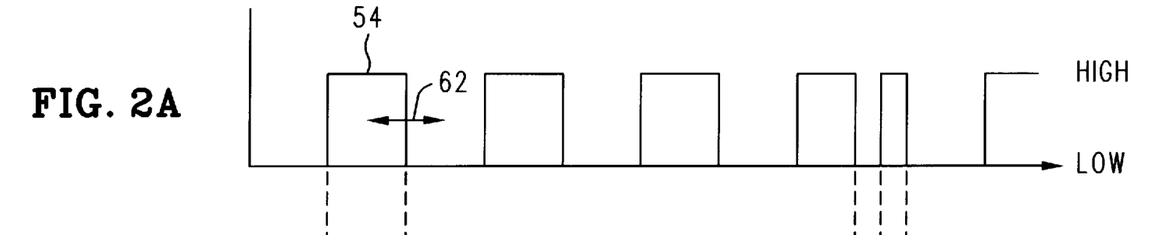
FIG. 2a is a graphical representation of the first switch control signal that is used to control the first switching device.
Figure 2B:
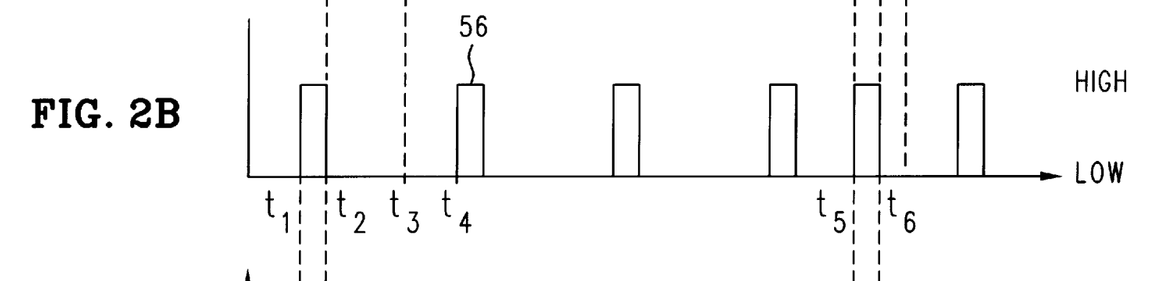
FIG. 2b is a graphical representation of the second switch control signal that is used to control the second switching device.

Referring now to FIGS. 2a and 2b, the control system 46 produces a first switch actuation signal 54 and a second switch actuation signal 56. The first and second switch actuation signals 54 and 56 are used to operate the first and second switching devices 32 and 42, respectively. The first switch actuation signal 54 may comprise a pulse width modulated (PWM) signal that may be in either a "high" state or a "low" state. When in the "high" state, the first switch actuation signal 54 places the first switching device 32 in the conducting or closed state. Conversely, when in the "low" state, the first switching device 32 is placed in the non-conducting or open state. The width 62 of the pulse width modulated (PWM) signal 54 is used to control the current output of the combined regulator/pulsing circuit 10. The second switch actuation signal 56 comprises a signal having a constant pulse width that may be in either the "high" or "low" states. When the second switch actuation signal 56 is in the "high" state, the second switching device 42 is placed in the conducting or closed state. When in the "low" state, the second switch actuation signal 56 switches the second switching device 42 to the non-conducting or open state.

The power supply having a combined regulator and pulsing circuit 10 may be operated in one of two modes depending on the desired performance of the circuit. In the first mode, referred to herein as the "passive arc suppression mode," the combined regulator/pulsing circuit 10 is operated in such a manner that the control system 46 periodically closes the second switching device 42 to reverse the polarity on the electrodes 16, 18. That is, the control system 46 causes the power supply having the combined regulator and pulsing circuit 10 to produce the polarity reversing pulses 58 (FIG. 2c) on DC output signal 64. This periodic reversing of the polarity on the electrodes 16, 18 tends to remove any space charge that may have accumulated on the electrodes 16, 18, thereby effectively preventing the development of conditions likely to lead to arcing. In most processing modes, such a periodic voltage polarity reversal will be sufficient to prevent the occurrence of arcs. However, in the event more robust arc suppression is desired or required, the control system 46 may be provided with an optional arc detection circuit 66.

When provided with the arc detection circuit 66, the combined regulator/pulsing circuit 10 may be operated in an "active arc suppression mode" in which the second switching device 42 is actuated whenever an arc condition is detected. As explained above, the actuation of the second switching device 42 produces a polarity reversing pulse 58 (FIG. 2c) which has the effect of almost immediately reversing the voltage potential on the electrodes 16 and 18, thus quenching the arc before it has a chance to fully develop and adversely affect the coating process.

The operation of the power supply having the combined regulator and pulsing circuit 10 in the passive arc suppression mode is best understood by referring to FIGS. 1 and 2a–2c. In order to accomplish the desired plasma deposition process (e.g., sputter deposition), the voltage on the second electrode 18 (i.e., the cathode) is maintained at a negative potential (e.g., –500 volts (V)) with respect to the first electrode 16 (i.e., the anode). This condition exists when the second switching device 42 is in the non-conducting state (i.e., when the second switch actuation signal 56 is "low"). The first switch actuation signal 54 may be in either the "high" or "low" states, as will be described in greater detail below. During this time, the process occurring within chamber 14 is more or less operating in a steady state, with a substantially constant current flowing through the plasma 60. During this operating state the second capacitor 40 will have a net reverse charge (indicated by the "+" and "−" signs) across its plates with respect to the polarity of the electrodes 16 and 18. The first capacitor 26 will essentially have the relative charge in the sense also indicated by the (+) and (−) signs shown in FIG. 1.

At a certain time $t_1$ (FIG. 2b), the second switch actuation signal 56 goes "high," which switches the second switching device 42 from the non-conducting (i.e., open) state to the conducting (i.e., closed) state. The second capacitor 40 will now be connected directly across the first and second electrodes 16 and 18, creating the polarity reversing pulse 58 and essentially instantly reversing the charge on the electrodes 16 and 18. That is, the charge on the second electrode 18 will now be essentially 100 volts (V) positive with respect to the charge on the first electrode 16. See FIG. 2c. This 100 volt potential is impressed across the second inductor 36, causing the current flowing through the second inductor 36 to increase in a substantially linear fashion.

Next, at a time $t_2$, the control circuit 46 causes the second switch actuation signal 56 to go "low" which returns the second switching device 42 to the non-conducting (i.e., open) state. At this point, the increased current flowing through the second inductor 36 causes the voltage on the second electrode 18 to more or less instantly swing negative with respect to the first electrode 16. However, instead of stopping at the previous potential of about –500 V, the increased current flowing through the second inductor 36 and the increased initial impedance of the non-conducting plasma 60 causes the voltage on the second electrode 18 to continue to go negative. Then, as the plasma 60 begins to conduct, the voltage on the second electrode 18 increases until it again reaches about –500 volts with respect to the first electrode 16 and the current through the second inductor 36 decays to its original value. The second switching device 42 remains in the non-conducting (i.e., open) state until a time $t_4$, when it is again switched to the conducting (i.e., closed) state and the cycle repeated, as described above.

At the same time the second switch actuation signal 56 goes "low" i.e., at time $t_2$, the control system 46 places the first switch actuation signal 54 in the "high" state. This causes the first switching device 32 to switch to the conducting state, diverting current from the diode 30 to switching device 32, i.e., switching device 32 provides a current path for current in the second inductor 36 to return to the negative (−) terminal of the rectifier circuit 20. As was mentioned above, the first switch actuation signal 54 comprises a pulse width modulated (PWM) signal wherein the width of the pulse (indicated by arrow 62) can be varied as necessary to control the current output of the power supply having the combined regulator and pulsing circuit 10. In one preferred embodiment, longer pulse widths 62 correspond to higher currents and vice-versa. However, even with the longest pulse width 62, the control system 46 always returns the first switch actuation signal 54 to the "low" state (i.e., at a time $t_3$) before or at the same time as the second switch actuation signal 56 goes "high" (i.e., at time $t_4$).

The first and second switch actuation signals are synchronized so that the first switch actuation signal 54 cannot go "high" until the second switch actuation signal 56 goes "low." Put in other words, the first switch actuation signal 54 is "slaved" to the second switch actuation signal 56 such that the first switch actuation signal 54 goes "high" at the same instant the second switch actuation signal 56 goes "low."

The power supply having a combined regulator and pulsing circuit 10 may be operated as follows to accomplish sputter deposition with the plasma processing system 12. When the combined regulator/pulsing circuit 10 is first turned on or activated, the control system 46 produces the first and second switch control signals 54 and 56 which control the operation of the first and second switching devices 32 and 42 in the manner described above. This results in a DC output signal 64 (FIG. 2c) being placed across the first and second electrodes 16, 18. The control circuit 46 varies the pulse width 62 of the first switching device actuation signal 54 as necessary to maintain the output current of the combined regulator/pulsing circuit 10 within a predetermined range, as determined by the current set signal 52. Current set signal 52 may be programmed in advance by the user and corresponds to a desired output current limit or range.

Each time the control system 46 switches the second switching device 42 to the conductive state (i.e., when the second switch actuation signal 56 goes "high"), the combined regulator/pulsing circuit 10 produces a polarity reversing pulse 58 which quickly reverses the polarity on the electrodes 16, 18 to reduce or eliminate arcing within the chamber 14. In one preferred embodiment, the polarity reversing pulses 58 occur periodically at intervals of about 0.05 milliseconds (ms), which is generally sufficient to reduce or eliminate entirely arcing. However, in the event more robust arc suppression is desired, the control system 46 may be provided with an arc detection circuit 66. Briefly, the arc detection circuit 66 detects the existence of an arc condition within the chamber 14 and instructs the control system 46 to make the first switch actuation signal 54 go "low" and the second switch actuation signal 56 go "high" (e.g., at a time $t_5$ in FIG. 2b). This high second switch actuation signal 56 switches the second switching device 42 to the conducting state which reverses the polarity on the electrodes 16 and 18 in the manner already described. Then, a short time later (e.g., 0.004 milliseconds (ms)) at a time $t_6$ the first switch actuation signal 54 again goes "high" and the second switch actuation signal 56 again goes "low." This returns the first switching device 32 to the conducting or closed state and the second switching device 42 to the non-conducting or open state.

A significant advantage associated with the power supply having a combined regulator and pulsing circuit 10 according to the present invention is that it is capable of quickly reversing the polarity across the first and second electrodes to discourage the formation of an arc condition within the process chamber 14. Another advantage of the present invention is that it contains a minimum number of energy storing circuit elements, which generally enhances operation and allows for fast response.

Having briefly described the power supply having the combined regulator and pulsing circuit 10, as well as some of its more significant features and advantages, the combined regulator/pulsing circuit 10, as well as the associated plasma processing system 12 that may be used with the combined regulator/pulsing circuit 10, will now be described in detail. However, before proceeding with the description of the various embodiments of the present invention, it should be noted that the various circuits are shown and described herein in simplified form for clarity and ease of understanding the present invention. That is, the various embodiments of the power supplies do not include systems, circuits, and elements that are not directly related to the operation of the present invention, but that may be required or desired in a particular application. For example, most power supplies utilized in plasma deposition processes include one or more control systems and feedback loops to regulation the operation of the power supplies and to allow them to be operated in several different modes, such as constant current or constant power modes. While some feedback and control circuits are shown and described herein since they pertain to the present invention, certain other control circuits and feedback systems are not shown and described herein. However, such systems and circuits could be easily provided by persons having ordinary skill in the art after having become familiar with the present invention.

Referring back now to FIG. 1, the power supply having the combined regulator and pulsing circuit 10 is shown as it may be used with a plasma processing system 12 of the type that may be used to accomplish various plasma processes. For example, in one preferred embodiment, the plasma processing system 12 may comprise a non-reactive sputter deposition system that may be used to deposit a thin film or coating (not shown) onto the surface of an object or substrate (also not shown) positioned within the process chamber 14. Alternatively, however, the combined regulator/pulsing circuit 10 and plasma processing system 12 could be used to accomplish other types of plasma processes, such as reactive sputter deposition or sputter etching. Therefore, the present invention should not be regarded as limited to the non-reactive sputter deposition process that is shown and described herein.

The power supply having the combined regulator and pulsing circuit 10 generates a DC output voltage signal 64 (FIG. 2c) that is placed across the first and second electrodes 16 and 18. The DC output voltage signal 64 produces an electric field (not shown) between the first and second electrodes 16 and 18 positioned within the process or vacuum chamber 14. The first electrode 16 is connected to the positive (+) output terminal of the combined regulator/pulsing circuit 10, thus serves as the anode. The first electrode or anode 16 may comprise any of a wide range of separate anode members. Alternatively, the anode or first electrode 16 may comprise the process chamber 14 itself. The second electrode 18 is connected to the negative (−) output terminal of the combined regulator/pulsing circuit 10, thus serves as the cathode. Accordingly, the second electrode 18 may comprise a cathode/target assembly (not shown) which contains the material (commonly referred to as the target) that is to be deposited on the surface of the object or substrate (also not shown). The cathode/target assembly utilized in one preferred embodiment of the present invention may comprise a planar magnetron cathode/target assembly of the type shown and described in U.S. Pat. No. 5,262,028 which is incorporated herein by reference for all that it discloses. Alternatively, other types of cathode/target assemblies, such as non-planar magnetrons or even regular (i.e., non-magnetron) diode sources could also be used. Therefore, the present invention should not be regarded as limited to any particular type of cathode/target assembly.

In accordance with its use to accomplish non-reactive sputter deposition processes, the process chamber 14 may include a process gas supply 68 which contains a supply of a suitable process gas (not shown), such as argon, although other gases could also be used. A process gas valve 70 connected between the process gas supply 68 and the process chamber 14 may be used to regulate the flow of process gas into the interior 72 of chamber 14. The process chamber 14 may also include a vacuum pump assembly 74 and a vacuum valve assembly 76 to maintain the interior 72 of the process chamber 14 within a range of pressures suitable for carrying out the desired process. For example, in most magnetron sputter deposition processes it is usually desirable to maintain the interior 72 of the process chamber 14 at a pressure of about 1 milliTorr (mTorr), although other pressures could also be used depending on the nature of the material being deposited and on other extrinsic factors.

It should be noted that process chambers (e.g., process chamber 14), as well as the various ancillary devices and systems (e.g., process gas supply systems, vacuum pumping systems, etc.) associated therewith, are well-known in the art and could be easily provided by persons having ordinary skill in the art after having become familiar with the present invention. Therefore, the particular process chamber 14 and related ancillary systems and devices utilized in one preferred embodiment of the invention will not be described in further detail.

If it is desired to configure the plasma processing system 12 to accomplish reactive sputter deposition, then the process chamber 14 may also be provided with a reactant gas source (not shown) that contains a supply of a suitable reactant gas. Examples of suitable reactant gases include, but are not limited to, oxygen ($O_2$), nitrogen ($N_2$), and hydrogen sulfide ($H_2S$). The reactant gas source (not shown) may also include a valve assembly (also not shown) to regulate the flow of the reactant gas into the interior 72 of process chamber 14. However, since such additional systems and devices required to accomplish reactive sputter deposition processes are also well-known in the art and could be easily provided by persons having ordinary skill in the art after having become familiar with the present invention, the additional systems and devices that may be required or desired to accomplish reactive sputter deposition also will not be described in further detail herein.

Still referring to FIG. 1, a power supply having the combined regulator and pulsing circuit 10 places a DC output signal 64 (FIG. 2c) across the first and second electrodes 16 and 18. The DC output signal 64 comprises a plurality of polarity reversing pulses 58 that are generated each time the second switching device 42 is placed in the conducting state. As will be described in greater detail below, this may occur on a periodic basis (when operating in the passive arc suppression mode). Alternatively, a polarity reversing pulse 58 may be produced when an arc condition is detected in the chamber 14 (when operating in the active arc suppression mode).

The power for the combined regulator and pulsing circuit 10 may be derived from a rectifier circuit 20 which converts alternating current (AC) produced by an alternating current source 22 to a direct current (DC) suitable for use by the combined regulator/pulsing circuit 10. Alternatively, any convenient supply of direct current could also be used to provide power to the combined regulator/pulsing circuit 10. In one preferred embodiment, the alternating current source 22 may comprise a conventional 240 volt, 3 phase, 60 Hz alternating current supply in which case the rectifier circuit 20 may comprise a conventional 3-phase rectifier circuit to convert the 3-phase AC into DC. If desired, the AC produced by the alternating current source 22 could be isolated from the power supply by placing a conventional wye-delta (Y-Δ) transformer between the alternating current source 22 and the rectifier circuit 20. However, since such isolation transformers are well-known, the transformer used in one preferred embodiment will not be described in further detail.

Alternatively, the alternating current source 22 may comprise a single phase supply in which case the rectifier circuit 20 would comprise a single phase rectifier circuit to convert the single phase alternating current into DC. In any event, since rectifier circuits for converting 3-phase or single phase alternating current into direct current are well known, the rectifier circuit 20 utilized in one preferred embodiment will not be described in further detail herein.

A first inductor 24 and a first capacitor 26 are connected in series across the positive (+) and negative (−) terminals of the rectifier circuit 20. The first inductor 24 and first capacitor 26 add inductive and capacitive reactance to the circuit and help dampen the power fluctuations resulting from the operation of the first and second switching devices 32 and 42. Accordingly, the first inductor 24 and the first capacitor 26 may comprise any of a wide range of values depending on the design voltage and power levels of the particular combined regulator/pulsing circuit 10, as well as on other extrinsic considerations. Thus, the present invention should not be regarded as limited to any particular values or ranges of values for the first inductor 24 and capacitor 26. By way of example, in one preferred embodiment the first inductor 24 may have an inductance in the range of about 0.2 millihenries (mH) to 10 mH (0.6 mH preferred), and the first capacitor 26 may have a capacitance in the range of about 1,000 microfarads ($\mu$F) to 100,000 $\mu$F (10,000 $\mu$F preferred).

The diode 30 and the first switching device 32 are connected in series across the first capacitor 26. It is preferred, but not required, that a transformer 34 be connected in series between the diode 30 and first switching device 32. Transformer 34 provides a current feedback signal 48 to the control system 46 that is related to the current flowing through the first switching device 32. Alternatively, other types of current sensing devices (not shown) could also be used. The first switching device 32 is connected to the control system 46 and is responsive to the first switch actuation signal 54 which switches the first switching device between a conducting or closed state and a non-conducting or open state. More specifically, when the first switch actuation signal 54 is in the "low" state (FIG. 2a), the first switching device is in the non-conducting or open state. Conversely, when the first switch actuation signal 54 is in the "high" state, the first switching device is in the conducting or closed state.

The diode 30, first switching device 32, and transformer 34 may comprise any of a wide range of components depending on the particular application and voltages and currents at which the power supply is to be operated. In one preferred embodiment, the diode 30 may comprise a diode rated at 1,000 volts (V) and 100 amperes (A), such as type APT2X101D100J available from Advanced Power Technology, Inc., of Bend, Oreg. The first switching device 32 comprises an insulated gate bi-polar transistor (IGBT), such as type 1MBI300L-120 available from Collmer Semiconductors of Dallas, Tex. Alternatively, other types of switching devices, such as metal oxide field effect transistors (MOSFETs) could also be used. Transformer 34 may comprise a current transformer having a turns ratio of about 200:1, such as type D1871 available from Coil Craft of Cary, Ill., although other types of transformers or current sensing devices could also be used.

A second inductor 36 is connected between the anode of diode 30 and the negative (−) output terminal of the combined regulator/pulsing circuit 10. An optional current sensor 38 may be connected in series between the anode of diode 30 and the second inductor 36. Current sensor 38 produces a current feedback signal 50 that is directed to the control system 46. In one preferred embodiment, the second inductor 36 has an inductance of 200 microhenries ($\mu$H), although other inductances could be used, again depending on the particular circuit, application, and other extrinsic factors. The current sensor 38 may comprise a model no. LA-205S available from LEM USA, Inc., of Milwaukee, Wis.

A second capacitor 40 and second switching device 42 are connected in series across the positive (+) and negative (−) output terminals of the combined regulator/pulsing circuit 10. The second switching device 42 is connected to the control system 46 and is responsive to the second switch actuation signal 56 (FIG. 2b). When the second switch actuation signal 56 is in the "low" state, the second switching device 42 is in the non-conducting or open state. Conversely, when the second switch actuation signal 56 is in the "high" state, the second switching device is in the conducting or closed state. As was the case for the other components comprising the combined regulator/pulsing circuit 10, the values and types of the second capacitor 40 and second switching device 42 may comprise any of a wide range of values and types depending on the particular circuit, intended application, and other extrinsic factors. Consequently, the present invention should not be regarded as limited to a second capacitor 40 and second switching device 42 having any particular type or value. By way of example, in one preferred embodiment, the first capacitor 40 has a capacitance in the range of 10 microfarads ($\mu$F) to 1,000 $\mu$F (100 $\mu$F preferred). The second switching device may comprise an IGBT, such as type 1MBI300L-120 available from Collmer Semiconductors of Dallas, Tex. Alternatively, other types of switching devices, such as MOSFETs could also be used.

The control system 46 may comprise a pulse generator or a combination of pulse generators suitable for generating the first and second switch actuation signals 54 and 56 based on the various current feedback signals 48 and 50 and based on the current set signal 52. In one preferred embodiment, the current set signal may be produced by a current set circuit (not shown) based on user selected input for a desired current operation level.

The first switch actuation signal 54 produced by the control system comprises a pulse width modulated (PWM) signal. Since the first switching device 32 is placed in the conducting state when the PWM signal 54 is in the "high" state, longer pulse widths 62 will correspond to higher output currents. Conversely, shorter pulse widths 62 correspond to lower output currents. The PWM signal 54 is synchronized with, or slaved to, the second switch actuation signal 56, so that the first switch actuation signal 54 can only go in the "high" state when the second signal 56 goes "low." This condition is illustrated in FIGS. 2a and 2b.

The synchronization of the first switch actuation signal 54 with the second switch actuation signal 56 in the manner described above is important in achieving the objects and advantages of the present invention. That is, if the first signal 54 is not slaved to the second signal 56, but could instead go "high" at any time, then the second inductor 36 could become saturated unless it is provided with a much greater inductance that is required by the circuit of the present invention.

As was mentioned above, the control system 46 may comprise any of a wide range of circuits (e.g., pulse generators) suitable for generating the first and second switch actuation signals 54 and 56 according to the requirements set forth above. Consequently, the present invention should not be regarded as limited to any particular control system or control system configuration. By way of example, in one preferred embodiment, the control system 46 may comprise a model no. UC3825 pulse generator circuit available from Unitrode Integrated Circuits Corp. of Merrimack, N.H.

A bias supply circuit 44 is connected across the second capacitor 40 by a pair of wires 86, 88. The bias supply circuit 44 maintains the charge on the second capacitor 40, thus compensates for the depletion of energy in the second inductor 36 and the second capacitor 40. In one preferred embodiment, the bias supply circuit 44 may comprise a relatively simple regulated power supply to maintain the charge across the second capacitor 40 within a predetermined range such as, for example, between about 30 to 150 volts. However, since regulated power supplies of the type that may be used to maintain the voltage across the second capacitor 40 within the predetermined range are well-known and could be easily provided by persons having ordinary skill in the art after having become familiar with the teachings of the present invention, the particular bias supply circuit 44 utilized in one preferred embodiment of the invention will not be described in further detail herein.

Figure 3:
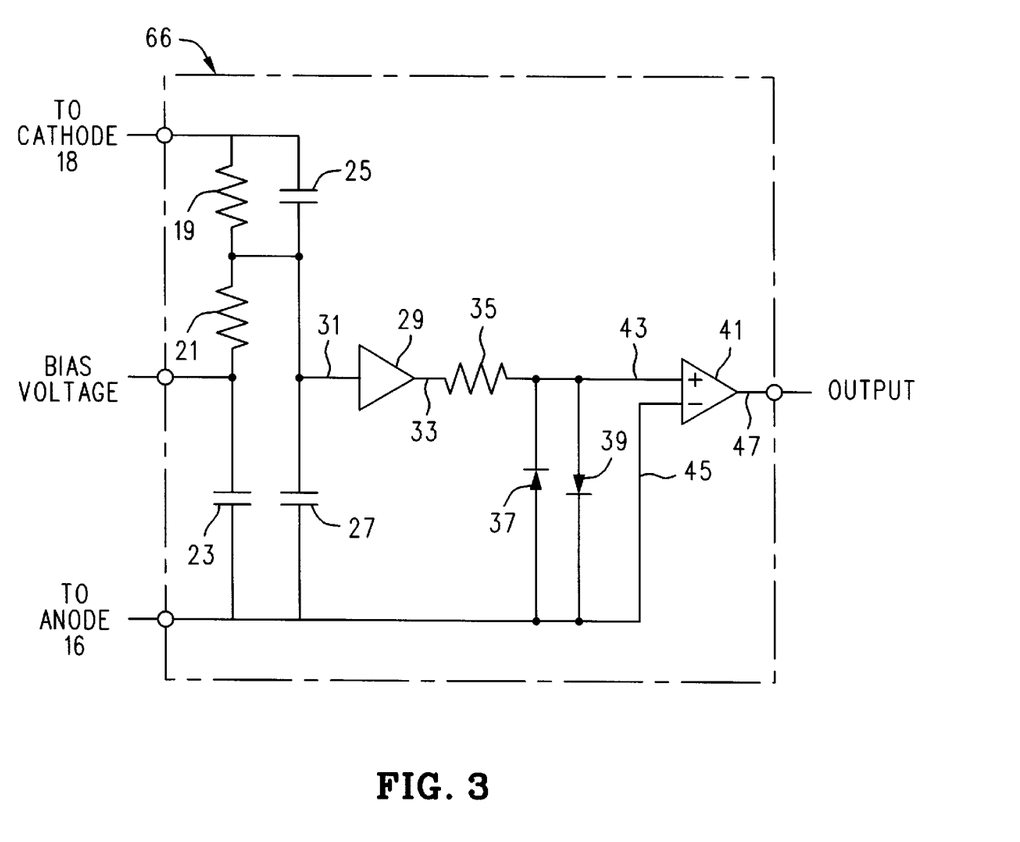
FIG. 3 is a schematic representation of the arc detection circuit shown in FIG. 1.

In certain circumstances, it may be advantageous to enhance the arc suppression capabilities of the combined regulator/pulsing circuit 10 described above by providing the control system 46 with an arc detection circuit 66. The arc detection circuit 66 works in concert with the normal operation of the control system 46 to reverse the voltage potential on the first and second electrodes 16 and 18 if an arc condition is detected during the time when the second switching device 42 is in the non-conducting i.e., open) state (e.g., during the time between two successive polarity reversing pulses 58). While many different kinds of arc detection devices are known and may be used with the present invention, one preferred embodiment of the present invention uses an arc detection circuit 66 substantially as shown in FIG. 3.

Essentially, arc detection circuit 66 may comprise first and second resistors 19 and 21 connected in series with a first capacitor 23 across the anode and cathode (i.e., the first and second electrodes 16 and 18). See FIG. 1. A second capacitor 25 is connected in parallel with the first resistor 19. A third capacitor 27 is connected in series with the second capacitor 25 so that it is also connected in parallel with the series arrangement of resistor 21 and capacitor 23. The combination of resistors 19, 21 and capacitors 25 and 27 form a compensated voltage divider network which provides to the buffer amplifier 29 a reduced-voltage signal 31 that more accurately represents the actual voltage signal (i.e., waveform) on the cathode and anode, than is possible with conventional, purely resistive voltage divider networks. A bias voltage is applied to resistor 21 to define the voltage level at which an arc is to be recognized. That is, an arc condition is assumed to exist and is recognized by the arc detection circuit 66 if the voltage potential between the electrodes starts to decrease and passes through a defined voltage level. The defined voltage level can be varied by adjusting the magnitude of the bias voltage applied to resistor 21.

The reduced voltage signal 31 from the compensated voltage divider network is then fed into buffer amplifier 29. The output signal 33 from buffer amplifier 29 is fed via resistor 35 to a diode clamp circuit comprising diodes 37 and 39. Under normal circumstances, the output signal 33 from buffer amplifier 29 will be negative. Hence, current will flow via resistor 35 and diode 37 and a negative clamped voltage of about 0.6 volts will appear across the input leads 43, 45 of comparator 41. Conversely, if the output signal 33 from amplifier 29 goes positive, diode 39 will conduct, again imposing a clamped voltage of about 0.6 volts across input leads 43 and 45 of comparator 41. The arrangement of diodes 37 and 39, along with resistor 35, forms a non-linear voltage divider network which substantially reduces the input impedance presented to the input of comparator 41, thus removing a substantial amount of the RF (i.e., radio frequency) noise present in the output signal 47. The comparator 41 produces an output signal 47 when the voltage across its input leads 43, 45 passes through zero. The output signal 47 from comparator 41 may then be used by the control system 46 to trigger the second switching device 42, i.e., place it in the conducting state while placing the second switching device 32 in the non-conducting or open state. It should be noted that in this application it will be desirable to design the arc detection circuit 66 so that it will ignore the low voltage on the cathode if the low voltage occurs during the normal reverse polarity pulse 58, i.e., during normal pulsing.

The operation of the power supply having the combined regulator and pulsing circuit 10 is best understood by referring to FIGS. 1 and 2a–c simultaneously. When the combined regulator/pulsing circuit 10 is first activated or turned on, the control system 46 begins to generate the first and second switch actuation signals 54 and 56. Ignoring for the moment the effect of the second switch actuation signal 56, when the first switch actuation signal 54 goes "high" the first switching device 32 is switched to the conducting state. This allows current to flow from the positive (+) terminal of the rectifier circuit, through the first inductor 24, plasma 60 (the plasma 60 is created by the electric field (not shown) developed across the first and second electrodes 16 and 18), second inductor 36, current sensor 38, transformer 34, and the first switching device 32. The current then returns to the negative (−) terminal of the rectifier circuit 20.

When the first switching device 32 is placed in the non-conducting state (i.e., when the control system 46 causes the first switch actuation signal 54 to switch to the "low" state), current continues to flow in the circuit, but this time through diode 30. The current gradually diminishes as the energy stored in the second inductor 36 is depleted. The time averaged output current of the combined regulator/pulsing circuit 10 can thus be controlled by varying the "on" time of the first switching device 32 (i.e., by varying the pulse width 62 of first switch actuation signal 54). See FIG. 2a. The desired width 62 of pulse 54 is controlled by the control system 46 based on the current feedback signal 50 produced by the current sensor 38. The current feedback signal 48 produced by the transformer 34 is used to turn-off the first switching device 32 in the event the current flow through the switching device 32 exceeds the maximum safe current that can be handled by the switch 32.

Figure 2C:
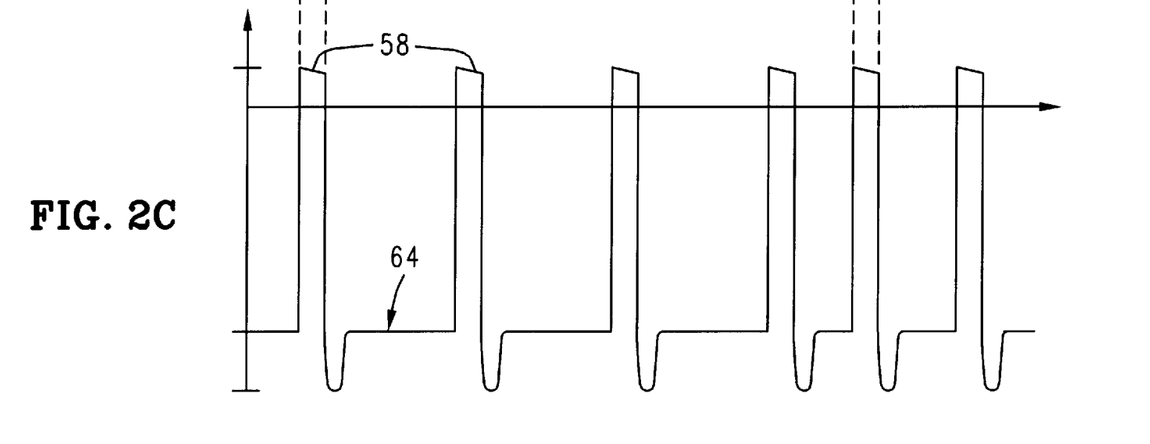
FIG. 2c is a graphical representation of a typical DC output signal that is placed on the cathode.

Considering now the effects of the second switch actuation signal 56, recall that the second switch actuation signal 56 results in the creation of the polarity reversing pulse 58 (FIG. 2c). In all operating conditions, the first switch 32 will be in the non-conducting or open state immediately before (or at the same time as) the second switch actuation signal 56 goes "high." In this condition, current will be flowing through the second inductor 36, current sensor 38, diode 30 and plasma 60. Now, when the second switching device 42 is switched to the conducting or closed state, the capacitor 40 will be connected across the first and second electrodes 16 and 18. Since the second capacitor 40 has a net reverse charge (as indicated by the "+" and "−" signs) with respect to the charge that was on the electrodes 16 and 18, the polarity on the electrodes will be substantially instantaneously reversed. That is, the voltage on the cathode 18 will swing positive with respect to the voltage on the anode 16. This condition is illustrated by the polarity reversing pulse 58 in FIG. 2c. The capacitor 40 discharges primarily through the inductor 36, which increases the current flowing in the inductor 36.

Next, the second switching device is turned off at the same time the first switching device 32 is turned back on. The first switch then provides a path for the current from the second inductor 36 back to the negative (−) terminal of the rectifier circuit 20. The plasma 60 is then re-ignited and the process in chamber 14 continues. The net reverse charge on the second capacitor 40 is replenished by the bias supply circuit 44 in the manner already described.

In the event the combined regulator/pulsing circuit 10 is provided with an arc detection circuit 66 and is operated in the "active arc suppression mode" the first switching device 32 is placed in the non-conducting or open state while the second switching device 42 is placed in the conducting state whenever an arc condition is detected in the chamber 14. If an arc condition is detected when the first switching device 32 is in the non-conducting state, then the operation of the circuit is exactly as described above, except that the polarity reversing pulse 58 is produced upon the detection of the arc condition. If, however, an arc condition is detected when the first switching device 32 is in the conducting state, the control system 46 simultaneously turns-off the first switching device 32 and turns-on the second switching device 42. This condition is illustrated in FIGS. 2a–c at times $t_5$ and $t_6$. That is, suppose an arc condition is detected at a time $t_5$. At this time, the first switch actuation signal 54 is "high" and the second switch actuation signal 56 is "low" (i.e., the first switching device 32 is conducting and the second switching device is non-conducting). The control system 46 causes the first switch actuation signal 54 to go "low" at the same time the second switch actuation signal 56 goes "high," thereby turning off the first switching device 32 and turning on the second switching device 42. This circuit configuration results in the creation of a polarity reversing pulse 58 which removes the arc condition. Then, at a time $t_6$, the control system turns off the second switching device 42 and turns back on the first switching device 32.

Figure 4:
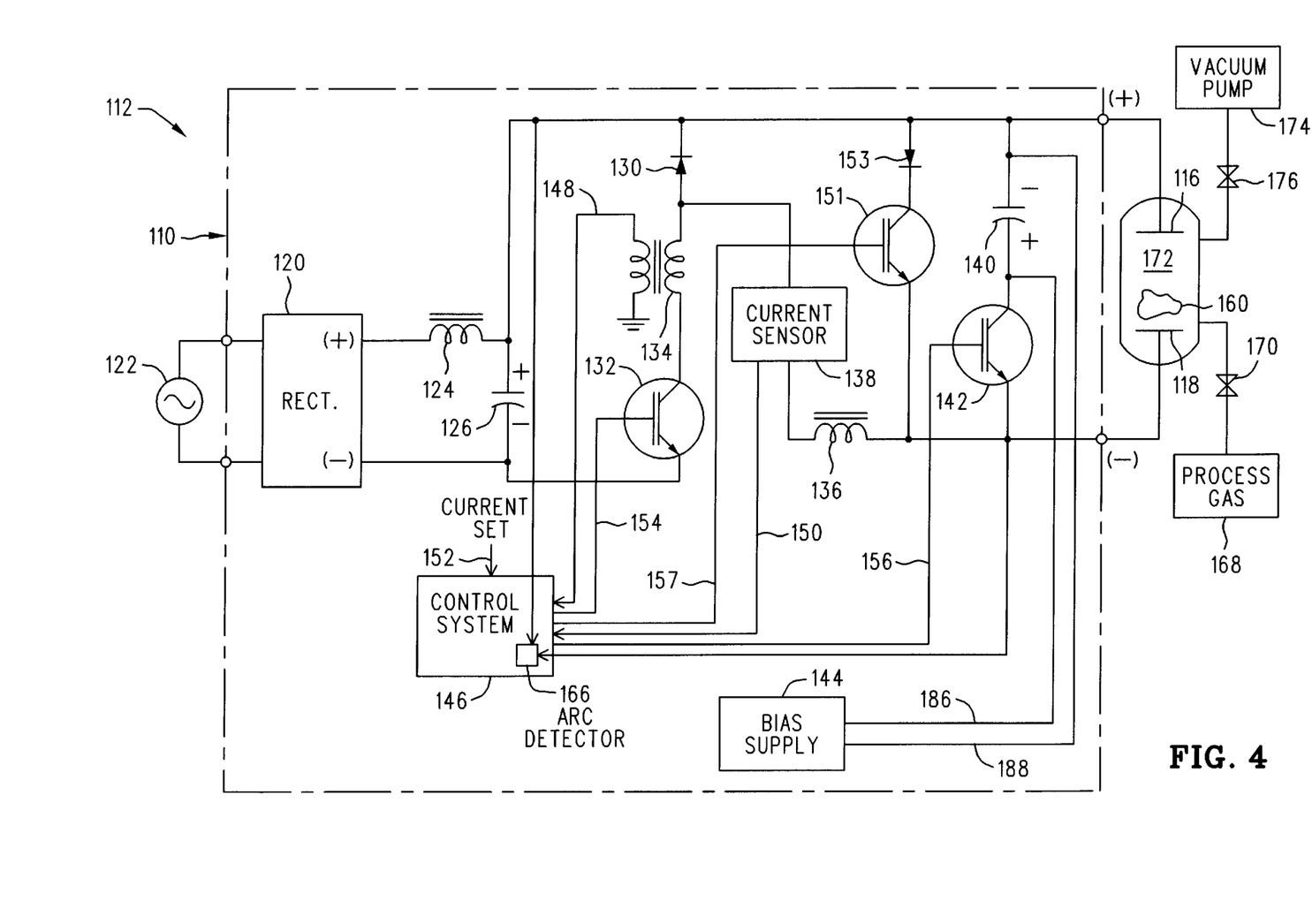
FIG. 4 is a schematic representation of a second embodiment of a combined regulator and pulsing circuit according to the present invention.
Figure 5:
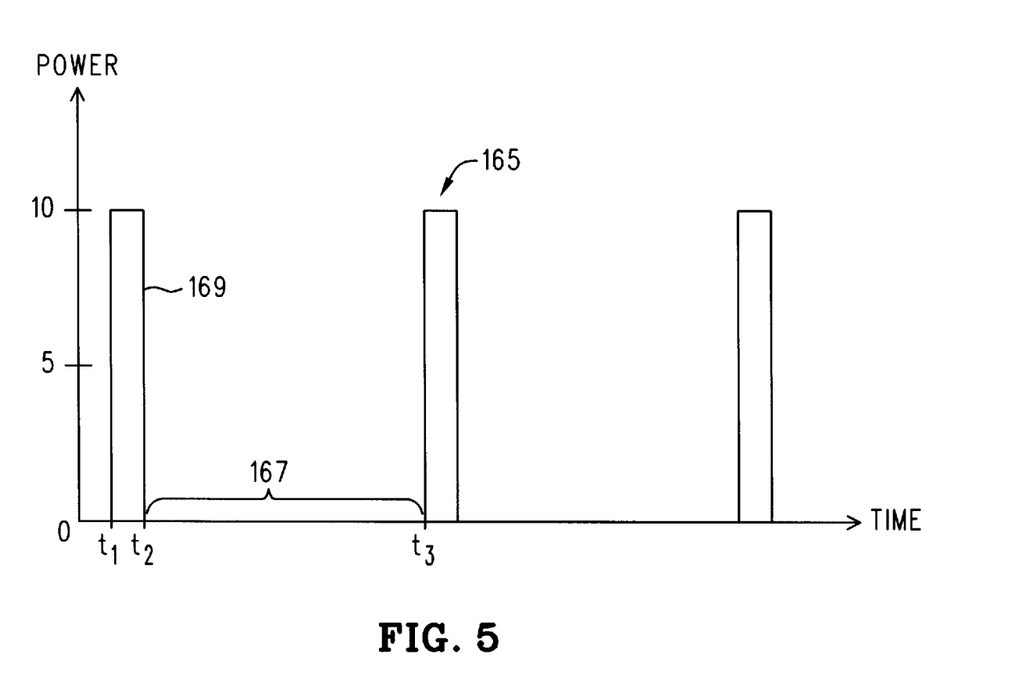
FIG. 5 is a graphical representation showing the power delivered to the electrodes of the process chamber by the second embodiment of the combined regulator and pulsing circuit shown in FIG. 4.

A second embodiment 110 of the power supply having a combined regulator and pulsing circuit is shown in FIG. 4. This second embodiment 110 is capable of producing a power output signal 165 substantially as shown in FIG. 5. The power output signal 165 allows the process within chamber 114 to be operated at high power levels for short periods of time (e.g., between $t_1$ and $t_2$), followed by a quiescent state 167 (e.g., between $t_2$ and $t_3$) wherein substantially no power is delivered to the process chamber 114.

Referring now primarily to FIG. 4, the second embodiment 110 of a power supply having a combined regulator and pulsing circuit is shown as it may be used with a plasma processing system 112 of the type that may be used to accomplish various plasma processes. For example, the plasma processing system 112 may comprise a non-reactive sputter deposition system that may be used to deposit a thin film or coating (not shown) onto the surface of an object or substrate (also not shown) positioned within the process chamber 114. Alternatively, however, the power supply 110 and plasma processing system 112 could be used to accomplish other types of plasma processes, such as reactive sputter deposition or sputter etching.

The power supply having the combined regulator and pulsing circuit 110 generates a DC output voltage signal that is placed across the first and second electrodes 116 and 118. The DC output voltage signal produces an electric field (not shown) between the first and second electrodes 116 and 118 positioned within the process or vacuum chamber 114. The first electrode 116 is connected to the positive (+) output terminal of the power supply 110, thus serves as the anode. The second electrode 118 is connected to the negative (−) output terminal of the power supply 110, thus serves as the cathode. Accordingly, the second electrode 118 may comprise a planar magnetron cathode/target assembly of the type shown and described in U.S. Pat. No. 5,262,028 which was incorporated by reference above. Alternatively, other types of cathode/target assemblies, such as non-planar magnetrons or even regular (i.e., non-magnetron) diode sources could also be used.

In accordance with its use to accomplish non-reactive sputter deposition processes, the process chamber 114 may include a process gas supply 168 which contains a supply of a suitable process gas (not shown), such as argon, although other gases could also be used. A process gas valve 170 connected between the process gas supply 168 and the process chamber 114 may be used to regulate the flow of process gas into the interior 172 of chamber 114. The process chamber 114 may also include a vacuum pump assembly 174 and a vacuum valve assembly 176 to maintain the interior 172 of the process chamber 114 within a range of pressures suitable for carrying out the desired process.

If it is desired to configure the plasma processing system 112 to accomplish reactive sputter deposition, then the process chamber 114 may also be provided with a reactant gas source (not shown) that contains a supply of a suitable reactant gas. Examples of suitable reactant gases include, but are not limited to, oxygen ($O_2$), nitrogen ($N_2$), and hydrogen sulfide ($H_2S$). The reactant gas source (not shown) may also include a valve assembly (also not shown) to regulate the flow of the reactant gas into the interior 172 of process chamber 114.

The second embodiment 110 of the power supply having a combined regulator and pulsing circuit may comprise a rectifier circuit 120 for converting alternating current produced by an alternating current source 122 to a direct current. As was the case for the first embodiment 10, the alternating current source 122 in one preferred embodiment may comprise a conventional 240 volt, 3 phase, 60 Hz alternating current supply in which case the rectifier circuit 120 may comprise a conventional 3-phase rectifier circuit to convert the 3-phase AC into DC. If desired, the AC produced by the alternating current source 122 could be isolated from the power supply by placing a conventional wye-delta (Y-Δ) transformer between the alternating current source 122 and the rectifier circuit 120. Alternatively, the alternating current source 122 may comprise a single phase supply in which case the rectifier circuit 120 would comprise a single phase rectifier circuit to convert the single phase alternating current into DC. In any event, since rectifier circuits for converting 3-phase or single phase alternating current into direct current are well known, the rectifier circuit 120 utilized in one preferred embodiment will not be described in further detail herein.

A first inductor 124 and a first capacitor 126 are connected in series across the positive (+) and negative (−) terminals of the rectifier circuit 120. The first inductor 124 and first capacitor 126 add inductive and capacitive reactance to the circuit and help dampen the power fluctuations resulting from the operation of the first, second, and third switching devices 132 and 142, and 151. Accordingly, the first inductor 124 and the first capacitor 126 may comprise any of a wide range of values depending on the design voltage and power levels of the particular power supply, as well as on other extrinsic considerations. By way of example, in one preferred embodiment the first inductor 124 may have an inductance in the range of about 0.3 millihenrys (mH) to 10 mH (0.6 mH preferred), and the first capacitor 126 may have a capacitance in the range of about 100 microfarads ($\mu$F) to 100,000 $\mu$F (10,000 $\mu$F preferred).

A first diode 130 and a first switching device 132 are connected in series across the first capacitor 126. A transformer 134 may be connected in series between the first diode 130 and the first switching device 132. Transformer 134 provides a current feedback signal 148 to the control system 146 that is related to the current flowing through the first switching device 132. Alternatively, other types of current sensing devices (not shown) could also be used. The first switching device 132 is connected to the control system 146 and is responsive to a first switch actuation signal 154 which switches the first switching device between a conducting or closed state and a non-conducting or open state.

The first diode 130, first switching device 132, and transformer 134 may comprise any of a wide range of components depending on the particular application and voltages and currents at which the power supply is to be operated. In one preferred embodiment, the first diode 130 may comprise a diode rated at 1,000 volts (V) and 100 amperes (A), such as type APT2X101D100J available from Advanced Power Technology, Inc., of Bend, Oreg. The first switching device 132 comprises an insulated gate bi-polar transistor (IGBT), such as type 1MBI300L-120 available from Collmer Semiconductors of Dallas, Tex. Alternatively, other types of switching devices, such as metal oxide field effect transistors (MOSFETs) could also be used. Transformer 134 may comprise a current transformer having a turns ratio of about 200:1, such as type D1871 available from Coil Craft of Cary, Ill., although other types of transformers or current sensing devices could also be used.

A second inductor 136 is connected between the anode of first diode 130 and the negative (−) output terminal of the combined regulator/pulsing circuit 110. An optional current sensor 138 may be connected in series between the anode of diode 130 and the second inductor 136. Current sensor 138 produces a current feedback signal 150 that is directed to the control system 146. In one preferred embodiment, the second inductor 136 has an inductance of 200 microhenries ($\mu$H), although other inductances could be used, again depending on the particular circuit, application, and other extrinsic factors. The current sensor 138 may comprise a model no. LA205S available from LEM USA, Inc., of Milwaukee, Wis.

A second capacitor 140 and second switching device 142 are connected in series across the positive (+) and negative (−) output terminals of the combined regulator/pulsing circuit 110. The second switching device 142 is connected to the control system 146 and is responsive to the second switch actuation signal 156. As was the case for the other components comprising the combined regulator/pulsing circuit 110, the values and types of the second capacitor 140 and second switching device 142 may comprise any of a wide range of values and types depending on the particular circuit, intended application, and other extrinsic factors. By way of example, in one preferred embodiment, the first capacitor 140 has a capacitance in the range of 10 microfarads ($\mu$F) to 1,000 $\mu$F (100 $\mu$F preferred). The second switching device 142 may comprise an IGBT, such as type 1MBI300L-120 available from Collmer Semiconductors of Dallas, Tex. Alternatively, other types of switching devices, such as MOSFETs could also be used.

A third switching device 151, along with a second diode 153 are also connected in series across the positive (+) and negative (−) output terminals of the combined regulator/ pulsing circuit 110. The third switching device 151 is connected to the control system 146 and is responsive to a third switch actuation signal 157 produced thereby. The third switching device 151 may comprise an IGBT, such as type 1MBI300L-120 available from Collmer Semiconductors of Dallas, Tex. Alternatively, other types of switching devices, such as MOSFETs could also be used. Diode 153 may comprise a diode rated for 100 amperes (A) at 1,000 volts (V), such as type APT2X101D100J available from Advanced Power Technology, Inc., of Bend, Oreg. As will be described in greater detail below, the short power pulses 169 comprising power output signal 165 are produced when the third switching device 151 is in the non-conducting state.

The control system 146 produces the first and second switch actuation signals 154 and 156 based on the various current feedback signals 148 and 150 and based on the current set signal 152. In addition, the control system 146 produces a third switch actuation signal 157 for switching the third switching device 151 between the conducting and non-conducting states. The first and second switch actuation signals 154 and 156 produced by the control system 146 may be identical to the first and second switch actuation signals 54 and 56 utilized in the first embodiment 10. That is, the first switch actuation signal 154 may comprise a PWM signal that is slaved to the second switch actuation signal 156. The current output of the combined regulator/pulsing circuit 110 may be controlled by varying the width of the PWM signal 154, in the manner already described for the first embodiment. The third switch actuation signal 157 is used to control the third switching device 151 to produce the power output signal 165 having power pulses 169 and quiescent periods 167, as will be described in greater detail below.

The control system 146 may comprise any of a wide range of circuits (e.g., pulse generators) suitable for generating the first, second, and third switch actuation signals 154, 156, and 157 according to the requirements set forth above. Consequently, the present invention should not be regarded as limited to any particular control system or control system configuration. By way of example, in one preferred embodiment, the control system 146 may comprise a model no. UC3825 pulse generator circuit available from Unitrode Integrated Circuits Corporation of Merrimack, N.H.

A bias supply circuit 144 may be connected across the second capacitor 140 by a pair of conductors 186, 188 to maintain the net reverse charge on the second capacitor 140. For example, in one preferred embodiment, the bias supply circuit 144 maintains the charge across the second capacitor 140 so that it is in the range of about 30 to 150 volts. The bias supply circuit 144 may be identical to the bias supply circuit 44 shown and described above. Therefore, the bias supply circuit 144 utilized in the second embodiment 110 of the power supply will not be described in further detail.

The control system 146 may also include an arc detection circuit 166 to allow the power supply 110 to be operated in either the "passive" or "active" arc suppression modes. However, since the arc detection circuit 166 is identical to the arc detection circuit 66 that was shown and described above, the arc detection circuit 166 also will not be described in further detail.

The operation of the second embodiment 110 of the power supply having the combined regulator and pulsing circuit is similar to the operation of the first embodiment 10. When the power supply 110 is first activated, the control system 146 places the third switching device 151 in the non-conducting state and operates the first and second switching devices 132 and 142 to produce a DC output signal substantially as shown in FIG. 2c. The power supply 110 may be operated in this condition for any convenient length of time, in which case the power output to the chamber 114 may be substantially constant. If it is desired to pulse the output of the power supply, to produce an output power signal 165 comprising a plurality of power pulses 169 followed by quiescent periods 167, then the control system 146 would operate the third switching device as necessary to achieve the desired power output signal 165.

For example, referring now to FIGS. 4 and 5, assume that the third switching device 151 is in the non-conducting state beginning at a time $t_1$. As long as the third switching device remains in the non-conducting state, the power supply 110 will produce a DC output signal substantially identical to the DC output signal 64 shown in FIG. 2c. That is, the DC output signal may comprise a plurality of polarity reversing pulses 58. Then, suppose at a time $t_2$ it is desired to quickly terminate the power to the chamber 114. At this time (i.e., time $t_2$) the control system 146 would place the third switching device 151 in the conducting state. This has the effect of short-circuiting the chamber 114, thereby almost instantly extinguishing the plasma 160. Of course, the current sensor 138 is used to limit the current of the power supply 110 when the third switching device 151 is in the conducting state. The power supply may be operated in this quiescent state 167 until a time $t_3$ when it is desired to again apply power to the chamber 114. Accordingly, the control system 146 returns the third switching device 151 to the non-conducting state. This process may be repeated any number of times and at any convenient frequency.

It is contemplated that the inventive concepts herein described may be variously otherwise embodied and it is intended that the appended claims be construed to include alternative embodiments of the invention except insofar as limited by the prior art.

What is claimed is:

1. A combined regulator and pulsing circuit for regulating a current flowing between a first electrode and a second electrode and for reversing a voltage polarity across the first and second electrodes, comprising:

a first diode having a cathode and an anode, the cathode of said first diode being electrically connected to a positive terminal of a supply of direct current, the cathode of said first diode also being electrically connected to a first output terminal of said combined regulator and pulsing circuit, the first output terminal being adapted to be electrically connected to the first electrode;

a first switching device electrically connected between the anode of said first diode and a negative terminal of the supply of direct current, said first switching device being switchable between a conducting state and a non-conducting state;

an inductor electrically connected between the anode of said first diode and a second output terminal of said combined regulator and pulsing circuit, the second output terminal being adapted to be electrically connected to the second electrode;

a capacitor having a first plate and a second plate, the first plate of said capacitor being electrically connected to the first output terminal;

a second switching device electrically connected between the second plate of said capacitor and the second output terminal, said second switching device being switchable between a conducting state and a non-conducting state; and a control system operatively associated with said first and second switching devices for switching said first and second switching devices between the conducting and non-conducting states.

2. The circuit of claim 1, wherein said control system places said first switching device in the conducting state when the second switching device is in the non-conducting state.

3. The circuit of claim 2, further comprising an output current sensor associated with said inductor, said output current sensor producing an output current feedback signal related to current flowing in said inductor and wherein said control system is operatively associated with said output current sensor and responsive to the output current feedback signal produced thereby, said control system operating said first switching device between the conducting and non-conducting states in response to the current flowing in said inductor.

4. The circuit of claim 3, further comprising a switching device current sensor associated with said first switching device, said switching device current sensor producing a switching device current feedback signal related to current flowing in said first switching device and wherein said control system is operatively associated with said switching device current sensor and responsive to the switching device current feedback signal produced thereby, said control system placing said first switching device in the non-conducting state if the current in said first switching device exceeds a predetermined maximum current.

5. The circuit of claim 1, further comprising a bias supply circuit connected across the first and second plates of said capacitor for maintaining a voltage potential across the first and second plates within a predetermined range of voltage potentials.

6. The circuit of claim 1, wherein the first and second electrodes are contained within a process chamber and wherein said control system includes and arc detection circuit for detecting an arc condition in the process chamber and wherein said control system switches said second switching device to the conducting state when an arc condition is detected.

7. The circuit of claim 1, further comprising a filter inductor connected in series between the cathode of said diode and the positive terminal of the supply of direct current and a filter capacitor connected across the cathode of said diode and the negative terminal of the supply of direct current.

8. The circuit of claim 1, further comprising a third switching device connected in series between the first and second output terminals of said combined regulator and pulsing circuit, said third switching device being switchable between a conducting state and a non-conducting state, said third switching device also being operatively associated with said control system and wherein said control system switches said third switching device between the conducting and non-conducting states.

9. The circuit of claim 8, further comprising a second diode connected in series with said third switching device.

10. A combined regulator and pulsing circuit for regulating a current flowing between a first electrode and a second electrode and for reversing a voltage polarity across the first and second electrodes, comprising:

a supply of direct current having a positive output terminal and a negative output terminal;

a first inductor having a first end lead and a second end lead, the first end lead of said first inductor being electrically connected to the positive output terminal of said supply of direct current;

a first capacitor electrically connected in series between the second lead of said first inductor and the negative terminal of said supply of direct current;

a first diode having a cathode and an anode, the cathode of said first diode being electrically connected to the second end lead of said first inductor, the cathode also being electrically connected to a first output terminal of said combined regulator and pulsing circuit, the first output terminal being adapted to be electrically connected to the first electrode;

a first switching device electrically connected in series between the anode of said first diode and the negative terminal of said supply of direct current, said first switching device being switchable between a conducting state and a non-conducting state;

a second inductor electrically connected in series between the anode of said first diode and a second output terminal of said combined regulator and pulsing circuit, the second output terminal being adapted to be electrically connected to the second electrode;

a second capacitor having a first plate and a second plate, the first plate of said second capacitor being electrically connected to the cathode of said first diode;

a second switching device electrically connected in series between the second plate of said second capacitor and the second output terminal of said combined regulator and pulsing circuit, said second switching device being switchable between a conducting state and a non-conducting state; and a control system operatively associated with said first switching device and said second switching device for operating said first and second switching devices in the conducting and non-conducting states.

11. The circuit of claim 10, further comprising a third switching device electrically connected in series across the first and second output terminals of said combined regulator and pulsing circuit, said third switching device being switchable between a conducting state and a non-conducting state, said third switching device being operatively associated with said control system, said control system operating said third switching device between the conducting state and the non-conducting state.

12. The circuit of claim 11, further comprising a second diode having an anode and a cathode connected in series with said third switching device so that the anode of said second diode is connected to the first output terminal and so that the cathode of said second diode is connected to said third switching device.

13. The circuit of claim 10, wherein said supply of direct current comprises a rectifier connected to an alternating current source.

14. The circuit of claim 10, wherein said control system produces a first switch actuation signal for switching said first switching device between the conducting state and the non-conducting state, said first switch actuation signal being switchable between a "high" state and a "low" state, the first switching device being in the conducting state when said first switch actuation signal is in the "high" state, said first switching device being in the non-conducting state and when said first switch actuation signal is in the "low" state.

15. The circuit of claim 14, wherein said control system produces a second switch actuation signal for switching said second switching device between the conducting state and the non-conducting state, said second switch actuation signal being switchable between a "high" state and a "low" state, the second switching device being in the conducting state when said second switch actuation signal is in the "high" state, said second switching device being in the non-conducting state and when said second switch actuation signal is in the "low" state.

16. The circuit of claim 15, wherein said first switch actuation signal is slaved to said second switch actuation signal so that said first switch actuation signal can only be in the "high" state when said second switch actuation signal is in the "low" state.

17. The circuit of claim 16, wherein said first switch actuation signal enters the "high" state at substantially the same time the second switch actuation signal enters the "low" state.

18. The circuit of claim 17, wherein said first switch actuation signal enters the "low" state when said second switch actuation signal enters the "high" state.

19. A method for regulating a current flowing between a first electrode and a second electrode and for reversing a voltage polarity between the first and second electrodes, comprising the steps of:

connecting the first electrode to a positive terminal of a supply of direct current;

connecting the second electrode to a combined regulator and pulsing circuit including a diode having a cathode and an anode, the cathode being electrically connected to the positive terminal of the supply of direct current; a first switching device being electrically connected in series between the anode of said diode and a negative terminal of the supply of direct current; an inductor electrically connected between the anode of said diode and the second electrode; a capacitor having a first plate and a second plate, the first plate of said capacitor being electrically connected to the first electrode; a second switching device being electrically connected in series between the second plate of said capacitor and the second electrode;

switching the first switching device between a conducting state and a non-conducting state to regulate the current flowing between the first and second electrodes; and switching the second switching device between a non-conducting state and a conducting state to reverse the voltage potential on the first and second electrodes.

20. The method of claim 19, wherein the first switching device is placed in the conducting state only when the second switching device is in the non-conducting state.

21. The method of claim 20, wherein the first switching device is placed in the conducting state at substantially the same time that the second switching device is placed in the non-conducting state.

22. The method of claim 21, wherein the first switching device is placed in the non-conducting state when the second switching device is placed in the conducting state.

* * * * *